(12) United States Patent
Li et al.

(10) Patent No.: US 7,666,741 B2
(45) Date of Patent: Feb. 23, 2010

(54) CORNER CLIPPING FOR FIELD EFFECT DEVICES

(75) Inventors: Yujun Li, Portland, OR (US); Kenneth T. Settlemyer, Jr., Bradenton, FL (US); Jochen Beintner, Reutlingen (DE)

(73) Assignee: International Business Machines Corporation, Armonk, NY (US)

( * ) Notice: Subject to any disclaimer, the term of this patent is extended or adjusted under 35 U.S.C. 154(b) by 490 days.

(21) Appl. No.: 11/333,109

(22) Filed: Jan. 17, 2006

(65) Prior Publication Data

US 2007/0167024 A1    Jul. 19, 2007

(51) Int. Cl.
*H01L 21/336* (2006.01)
(52) U.S. Cl. .............. 438/268; 438/753; 257/329; 257/353; 257/E21.629
(58) Field of Classification Search ............ 438/268, 438/753; 257/329, 353, E21.629
See application file for complete search history.

(56) References Cited

U.S. PATENT DOCUMENTS

| | | | | |
|---|---|---|---|---|
| 5,405,454 A | * | 4/1995 | Hirai et al. ............. | 148/33.2 |
| 5,849,624 A | | 12/1998 | Fazan ..................... | 438/398 |
| 6,566,273 B2 | | 5/2003 | Kudelka .................. | 438/733 |
| 6,734,077 B2 | | 5/2004 | Forster ................... | 438/386 |
| 2004/0197975 A1 | | 10/2004 | Krivokapic ............. | 438/200 |
| 2006/0086977 A1 | * | 4/2006 | Shah et al. .............. | 257/347 |
| 2007/0001173 A1 | * | 1/2007 | Brask et al. ............. | 257/67 |
| 2007/0166900 A1 | | 7/2007 | Li ........................... | 438/412 |

* cited by examiner

*Primary Examiner*—Steven J Fulk
(74) *Attorney, Agent, or Firm*—George Sai-Halasz

(57) ABSTRACT

A method is presented for fabricating a non-planar field effect device. The method includes the production of a Si based material Fin structure that has a top surface substantially in parallel with a {111} crystallographic plane of the Si Fin structure, and the etching of the Si Fin structure with a solution which contains ammonium hydroxide ($NH_4OH$). In this manner, due to differing etch rates in ammonium hydroxide of various Si based material crystallographic planes, the corners on the Fin structure become clipped, and angles between the horizontal and vertical planes of the Fin structure increase. A FinFET device with clipped, or rounded, corners is then fabricated to completion. In a typical embodiment the FinFET device is selected to be a silicon-on-insulator (SOI) device.

12 Claims, 3 Drawing Sheets

CORNER CLIPPING FOR FIELD EFFECT DEVICES

FIELD OF THE INVENTION

The present invention relates to devices used in integrated circuits and their manufacturing. More particularly, the present invention relates to improving the performance of non-planar field effect semiconductor devices.

BACKGROUND OF THE INVENTION

Today's integrated circuits include a vast number of devices. Smaller devices and shrinking ground rules are the key to enhance performance and to improve reliability. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy.

There is great difficulty in maintaining performance improvements in devices of deeply submicron generations. Several avenues are being explored for keeping device performance improvements on track. With shortening gate lengths, the so called short channel effects (SCE), most notably the "drain induced barrier lowering" (DIBL) pose severe roadblocks to miniaturization. These effects can be mitigated by introducing basic structural changes in the devices, such as, for instance, using multiple gates.

A proposed way out of this problem is the use of double gated devices. Such a device is not simply a planar structure conducting on one surface, but conducting on two sides of the device body. The reasons that a double gate device can be downscaled further than a regular planar device are relatively complex, but they have been already given in the technical literature, for instance in: "Device Design Considerations for Double-Gate, Ground-Plane, and Single-Gated Ultra-Thin SOI MOSFET's at the 25 nm Channel Length Generation," by H.-S. P. Wong, et al, 1998 IEDM Tech Dig., pp. 407-10.

A variation of the double gated device is the so called FinFET, or Tri-Gate, device. These devices are non-planar, or three dimensional, structures hosted by a Fin structure. In FinFETs, the body of the transistor is formed in an island rising out of a planar background, typically having both vertical and horizontal surfaces. The gate of the FinFET is engaging the top surface, as well as, the vertically oriented body on both faces, or sides, resulting in three connected planes being used for transistor channel formation. FinFETs/Tri-Gates have several advantages, such as better SCE, better downscaling potential, and thus, are promising extensions of the mainline semiconductor technology.

A problem with FinFET devices arises precisely from the fact that the channel is formed on multiple connected planes. Where the plains of the FinFET body meet they form an angle, typically of 90°. This gives rise to the well known corner effect device problem. In the corner the electric field pattern during device operation is different than in the planar region of the device. This results in undesirable device effects, most notably in a lowered threshold voltage for the corner region. The more acute the angle at which the top plane and side planes meet, the more pronounced the corner effect is. For the sake of good device performance it would be desirable to eliminate as much as possible sharp corners in FinFET devices by rounding the intersections between the connected planes. One known approach to rounding corners is to expose the Fin structure silicon islands to a $H_2$-anneal. However, the control of this process is quite cumbersome, leading to poor reproducibility during manufacturing.

In general, FinFET devices and their manufacturing is well suited to semiconductor-on-insulator (SOI), usually silicon-on-insulator, technology. SOI devices typically are fabricated in a thin semiconductor layer disposed over an insulator layer. Most commonly, the insulator layer is a so called buried oxide layer on a silicon (Si) substrate.

SUMMARY OF THE INVENTION

In view of the problems discussed above, embodiments of the present invention disclose a method for clipping the corners of the Fin structure with the use of an anisotropic wet etch, thereby reducing the corner effect problems with the FinFET operation.

A method is disclosed for fabricating a field effect device, which method includes producing a Fin structure of a Si based material having a top surface substantially in parallel with a {111} crystallographic plane of the Fin structure, and wet etching the Fin structure with a solution that contains ammonium hydroxide ($NH_4OH$). In this manner, due to differing etch rates in ammonium hydroxide of various Si based material crystallographic planes, the corners on the Fin structure become clipped, and angles between the horizontal and vertical planes of the Fin structure become larger. The FinFET device with the clipped corners is then fabricated to completion. In a representative embodiment the FinFET device is selected to be a silicon-on-insulator (SOI) device.

BRIEF DESCRIPTION OF THE DRAWINGS

These and other features of the present invention will become apparent from the accompanying detailed description and drawings, wherein.

DETAILED DESCRIPTION OF THE INVENTION

Multi-sided, typically three sided, non-planar FET device bodies are becoming frequently used in microelectronics for their advantages in performance and suitability for miniaturization. Such FET device bodies are commonly referred to as "Fin" structures. In general, they are Si based material islands, typically on an insulator, such as a buried oxide on a Si wafer. In alternate embodiments the Fin structure is etched out of a wafer directly, without underlying insulator. The gate of the FinFET device follows the contour of the Fin structure, allowing conducting channels to form on multiple sides of the Fin structure. In this disclosure the term FinFET refers to a completed device, while the term Fin structure refers to the semiconductor island which serves as the host for the active device components, such as the channel. In various embodiments of this disclosure the Si based material may be essentially pure Si, or may be a SiGe alloy with up to approximately 60% of Ge concentration.

In most common embodiments the Fin structure is a rectangular block protruding out of a planar surface, with a wide variety of possible width to length ratios. The prior art knows a variety of methods for fabricating such rectangular block Fin structures. Fin structures and FinFET devices have been dealt with earlier, for instance, in U.S. patent application Ser. No.: 10/732,322, published under No.: 20050127362, titled "Sectional Field Effect Devices and Method of Fabrication" by Y. Zhang et al, incorporated herein by reference, and taught in U.S. Pat. No. 6,909,186 entitled: "High performance FET devices and methods therefor" to J. O. Chu, incorporated herein by reference.

Figure 1:
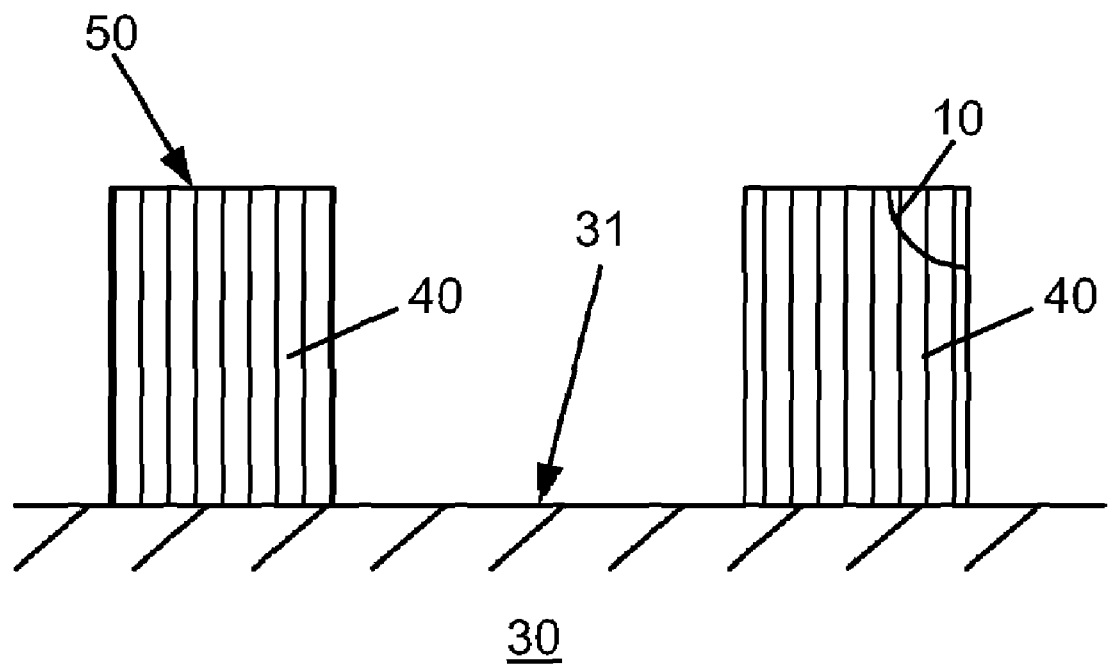
FIG. 1 shows a schematic cross sectional view of Si based material Fin structures as fabricated by conventional methods.

FIG. 1 shows a schematic cross sectional view of Si based material Fin structures as fabricated by conventional methods, a preferred starting point for applying the methods of the present invention. A platform 30 supports the Fin structures 40. The platform, or substrate, 30, has a principal surface 31. In an exemplary embodiment the starting point of a FinFET device is a SOI wafer. The silicon based material islands, which are the Fin structures 40, are defined, for instance, by using lithography, or a sidewall image transfer technique, or any other technique known in the art. The exposed Si based material is removed, for instance, with a reactive ion etch (RIE), leaving the Fin structure islands 40 in place. In case of an SOI wafer the Si based material typically is completely removed apart of the islands, and the substrate 30 is the insulator of a SOI wafer, typically $SiO_2$. However, in alternate embodiments the starting point can be a Si substrate, in which case the support platform 30 is Si. The Fin structures 40 would be formed in the same manner as in the case of an SOI wafer, except that the Si based material is not completely removed, but only to a certain depth, leaving in place protruding silicon based material islands. Typically, the Fin structures 40 are positioned on the principal surface 31 of the substrate 30. The height of the Fin structures depending on particular embodiments, can be in the range from about 2 nm to 500 nm. In exemplary embodiments of the invention the as fabricated Fin structures are of a rectangular cross section, as shown in FIG. 1. The particular shape of the cross section can vary greatly, from a case when the height is much larger than the width, or conversely, when the width is much larger than the height.

For any width to height ratio of the Fin structure, the corner 10 between the top surface and a side surface is of approximately 90°. The relative acuteness of this corner 10 is the source of the problem with FinFET device operation. A FinFET device fabricated on a Fin structure with right angle (approximately 90°) corners would have to cope with the well known corner effect problem. Embodiments of the present invention eliminate right angle corners from the device active region, which is the region shown in cross section on FIGS. 1-3.

The Fin structure 40 has a top surface 50. This top surface 50 in preferred embodiments of the invention is substantially in parallel with a {111} crystallographic plane of the Si based material Fin structure 40.

Figure 2:
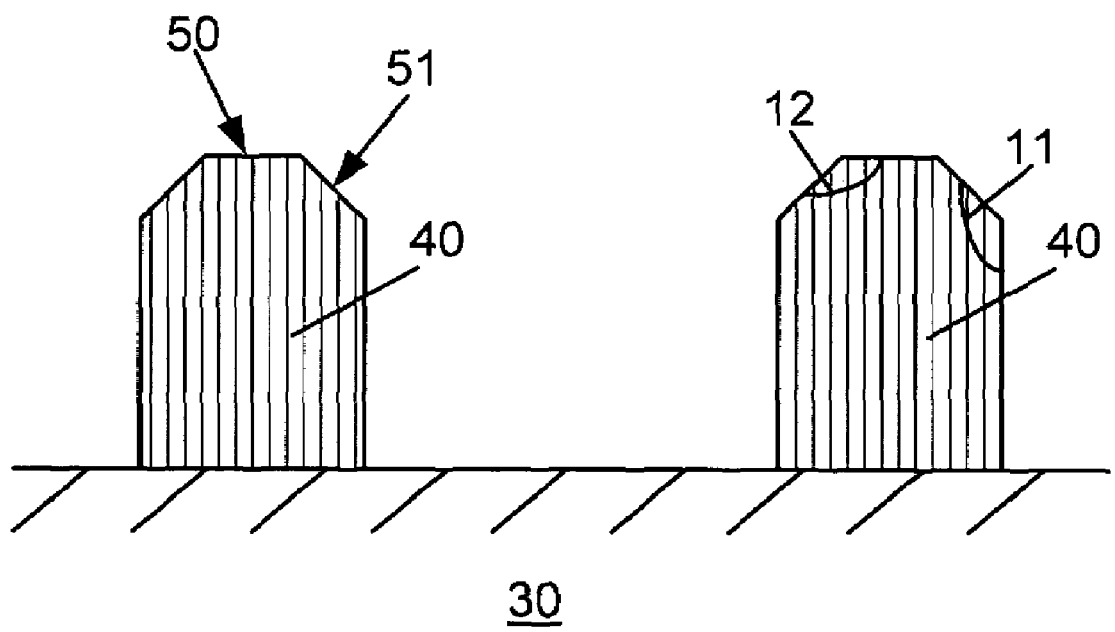
FIG. 2 shows a schematic cross sectional view of Si based material Fin structures after corner clipping has occurred due to an anisotropic wet etch.

FIG. 2 shows a schematic cross sectional view of Fin structures after the corner clipping has occurred due to an anisotropic wet etch. The clipping of corners results from applying a combination of the crystallographic orientation of the Fin structures and a particular anisotropic wet etch. In representative embodiments of the invention the top surface of the Si based material Fin structure is substantially in parallel with a {111} crystallographic plane, and the Si based material Fin structure is being etched using an ammonium hydroxide ($NH_4OH$) based wet etch chemistry. With a Si based material top surface orientation substantially in parallel with a {111} crystallographic plane, the upper corners of the Si based material Fin structure etch faster than the Si based material top surface and side surfaces. This type of anisotropic etching yields a Fin structure shape with clipped corners, as shown in FIG. 2. The anisotropic Si etching characteristics of $NH_4OH$ have been studied already, as it is taught, for instance, in U.S. Pat. No. 6,566,273 entitled: "Etch selectivity inversion for etching along crystallographic directions in silicon" to S. Kudelka, incorporated herein by reference.

The selection of the $NH_4OH$ concentration in the etch solution, the etching temperature, and the etching time all influence the amount of corner clipping on the Si based material Fin structures.

The anisotropic wet etch solution in representative embodiments is a mixture of water and ammonium hydroxide ($NH_4OH$), desirably in about between 15:1 and 200:1 ratios. A water to $NH_4OH$ ratio of approximately 160:1 is preferable for typical embodiments of the invention. The water used in the wet etch solution is preferably deionized water (DI). Furthermore, in exemplary embodiments the water of the wet etch solution is also degasified (dissolved gases, preferably oxygen content, reduced).

During the anisotropic etch of the Fin structure, the temperature of the wet etch solution in representative embodiments may be selected to be between 25° C. and 70° C., with about 48° C. being preferred.

In typical embodiments the etch rate of the corner plane 51 is approximately two orders of magnitude faster than the etch rate of the top or side planes. The etch rate of the corner plane 51 is in the range of about 1-10 nm per minute. The amount of clipping in representative embodiments can be controlled by regulating the duration of the wet etching.

Having achieved the desired amount of clipping, the angles 11 and 12 between the corner plane 51 and the side and top planes have become larger than right angles. The angles formed after the wet etch, 11 and 12, in general are not of the same size. Their size may depend on the crystallographic orientation of the Fin structure. The clipped corners on the Fin structure may have angles of between approximately 125° and 145°. These larger angles are preferred to the 90° angles found on the Fin structure before the application of the anisotropic wet etch. With the larger angles the FinFET fabricated on the clipped Fin structure has better device electrical behavior due to a reduced, possibly eliminated, corner effect.

If the Si based material Fin structure is on SOI, and an isotropic $SiO_2$ etch, such as diluted hydrofluoric acid (HF) is applied, then the Fin structure would be under etched at the bottom. The anisotropic $NH_4OH$ based wet etch would then also clip the corners at the bottom part of the Fin structure.

One skilled in the art would recognize that if different crystallographic wet etch chemistries were used, instead of the one based on $NH_4OH$, different Si based material orientations are etched faster than others. By choosing the right Si based material Fin structure top surface orientation and the right Si substrate rotation, corner clipping would then be possible, as well.

Figure 3:
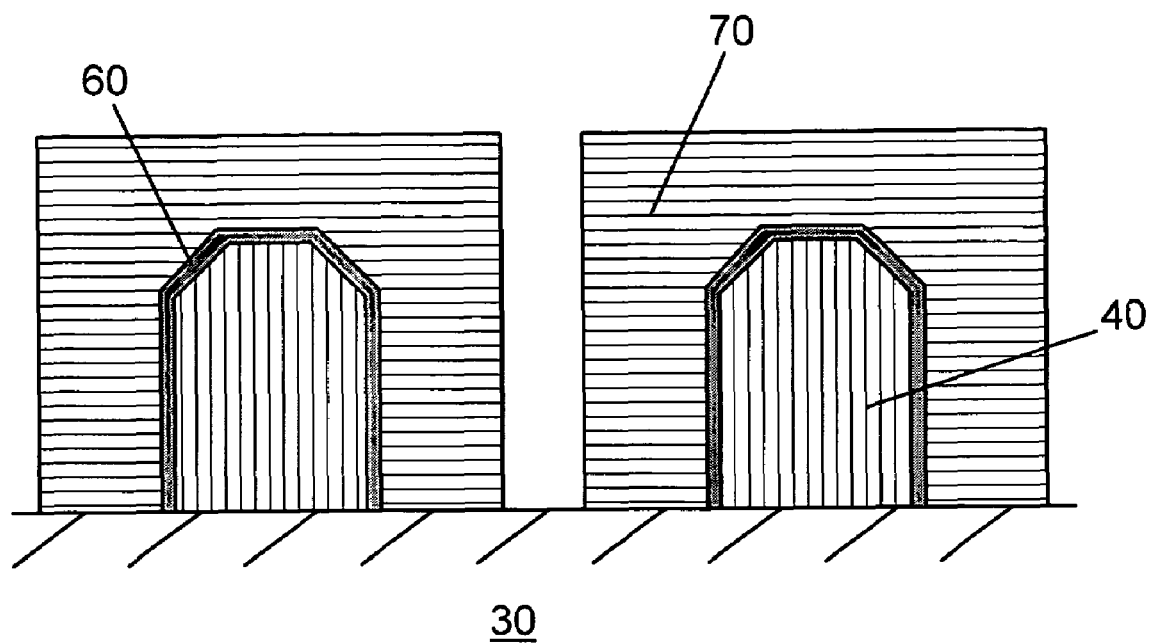
FIG. 3 shows a schematic cross sectional view at a latter stage in the fabrication of the FinFET device.

FIG. 3 shows a schematic cross sectional view at a latter stage in the fabrication of the FinFET device. Having achieved the desired corner clipping on the Fin structure, one can complete the fabrication of the field effect device by ways known in the art. FIG. 3 depicts this process at a stage where the gate insulator 60 and the gate 70 have already been applied. When the fabrication of the FinFET device is fully completed, the device stands ready to be used in high performance circuits, typically ones desired in high end processors.

Many modifications and variations of the present invention are possible in light of the above teachings, and could be apparent for those skilled in the art. The scope of the invention is defined by the appended claims.

We claim:

1. A method for fabricating a field effect device, comprising:
    providing a substrate having a primary surface;
    producing a Fin structure of a Si based material on said primary surface of said substrate, said Fin structure having corners and crystallographic planes, wherein said Fin structure comprises a top surface, wherein said top surface is parallel to and spaced apart of said primary surface of said substrate, and wherein said top surface is substantially in parallel with a {111}crystallographic plane; and
    wet etching said Fin structure with a solution comprising ammonium hydroxide ($NH_4OH$), whereby said corners on said Fin structure become clipped due to differing etch rates of the Si crystallographic planes in said solution.

2. The method of claim 1, wherein said solution is selected to be a mixture of water and ammonium hydroxide.

3. The method of claim 2, wherein in said mixture the ratio of water to ammonium hydroxide is selected to be between 15:1 and 200:1.

4. The method of claim 3, wherein in said mixture the ratio of water to ammonium hydroxide is selected to be approximately 160:1.

5. The method of claim 2, wherein said solution is selected to be in the temperature range between 25° C. and 70° C.

6. The method of claim 5, wherein said solution is selected to be at the temperature of about 48° C.

7. The method of claim 2, wherein in said mixture said water is deionized.

8. The method of claim 2, wherein in said mixture said water is degasified.

9. The method of claim 1, wherein said field effect device is selected to be a silicon-on-insulator (SOI) device.

10. The method of claim 1, wherein following said wet etching, said corners on said Fin structure have angles in the approximate range of 125° to 145°.

11. The method of claim 1, wherein said Si based material is selected to be essentially pure Si.

12. The method of claim 1, further comprising:
    completing fabrication of said field effect device.

* * * * *